(12) United States Patent
Amit

(10) Patent No.: US 8,666,532 B2
(45) Date of Patent: Mar. 4, 2014

(54) METHOD AND SYSTEM FOR CONTROLLING A MANUFACTURING PROCESS

(75) Inventor: Rafi Amit, Atlit (IL)

(73) Assignee: Camtek Ltd., Migdal Haemek (IL)

( * ) Notice: Subject to any disclaimer, the term of this patent is extended or adjusted under 35 U.S.C. 154(b) by 402 days.

(21) Appl. No.: 12/678,148

(22) PCT Filed: Jul. 22, 2008

(86) PCT No.: PCT/IL2008/001011
§ 371 (c)(1),
(2), (4) Date: Oct. 18, 2010

(87) PCT Pub. No.: WO2009/013741
PCT Pub. Date: Jan. 29, 2009

(65) Prior Publication Data
US 2011/0029121 A1    Feb. 3, 2011

Related U.S. Application Data

(60) Provisional application No. 60/951,211, filed on Jul. 22, 2007, provisional application No. 60/954,078, filed on Aug. 6, 2007.

(51) Int. Cl.
*G07F 7/02* (2006.01)

(52) U.S. Cl.
USPC ........... 700/121; 700/114; 700/245; 700/110; 700/109

(58) Field of Classification Search
None
See application file for complete search history.

(56) References Cited

U.S. PATENT DOCUMENTS

| | | | |
|---|---|---|---|
| 5,142,828 A * | 9/1992 | Curry, II | 451/36 |
| 5,498,877 A * | 3/1996 | Shiraki | 250/491.1 |
| 6,061,606 A * | 5/2000 | Ross | 700/121 |
| 6,077,756 A * | 6/2000 | Lin et al. | 438/401 |
| 6,248,602 B1 * | 6/2001 | Bode et al. | 438/14 |
| 6,309,944 B1 * | 10/2001 | Sheng et al. | 438/401 |
| 6,512,237 B2 * | 1/2003 | Nakasugi et al. | 250/491.1 |
| 6,636,313 B2 * | 10/2003 | Chen et al. | 356/401 |
| 6,700,648 B2 * | 3/2004 | Jun et al. | 355/77 |
| 6,753,120 B2 * | 6/2004 | Kim | 430/30 |
| 6,803,292 B2 * | 10/2004 | Kim et al. | 438/401 |
| 6,819,426 B2 * | 11/2004 | Sezginer et al. | 356/401 |
| 6,944,517 B2 * | 9/2005 | Krupyshev | 700/114 |
| 6,979,577 B2 * | 12/2005 | Higashi | 438/5 |
| 6,982,793 B1 * | 1/2006 | Yang et al. | 356/401 |
| 7,042,569 B2 * | 5/2006 | Sezginer et al. | 356/401 |
| 7,046,361 B1 * | 5/2006 | Yang et al. | 356/401 |
| 7,068,833 B1 * | 6/2006 | Ghinovker et al. | 382/144 |
| 7,080,330 B1 * | 7/2006 | Choo et al. | 716/136 |
| 7,289,213 B2 * | 10/2007 | Mieher et al. | 356/401 |
| 7,317,531 B2 * | 1/2008 | Mieher et al. | 356/401 |

(Continued)

*Primary Examiner* — Kavita Padmanabhan
*Assistant Examiner* — Christopher E Everett
(74) *Attorney, Agent, or Firm* — Oren Reches

(57) ABSTRACT

A method, system and computer program product for controlling a manufacturing process of an electronic circuit, the method includes: calculating at least one layer misalignment between layers of an electrical circuit that are expected to be mutually aligned; wherein the layers are manufactured by at least a direct imaging device that exposes a photo-resistive material to radiation to provide a pattern; selecting, in response to the at least one layer misalignment and in response to at least one allowable misalignment threshold, a selected response out of: manufacturing at least one additional layer of the electrical circuit; and stopping the manufacturing process of the electrical circuit; and participating in executing the selected response.

18 Claims, 5 Drawing Sheets

(56) References Cited

U.S. PATENT DOCUMENTS

| | | | | |
|---|---|---|---|---|
| 7,411,294 B2* | 8/2008 | Nakano et al. | | 257/728 |
| 7,415,318 B2* | 8/2008 | Higashi | | 700/121 |
| 7,442,579 B2* | 10/2008 | Chen et al. | | 438/108 |
| 7,550,303 B2* | 6/2009 | Argandona et al. | | 438/18 |
| 8,138,498 B2* | 3/2012 | Ghinovker | | 257/48 |
| 2003/0223630 A1* | 12/2003 | Adel et al. | | 382/145 |
| 2005/0012928 A1* | 1/2005 | Sezginer et al. | | 356/401 |
| 2005/0026385 A1* | 2/2005 | Kim et al. | | 438/401 |
| 2005/0122516 A1* | 6/2005 | Sezginer et al. | | 356/401 |
| 2005/0157297 A1* | 7/2005 | Abdulhalim et al. | | 356/401 |
| 2005/0181571 A1* | 8/2005 | Lin et al. | | 438/377 |
| 2006/0197950 A1* | 9/2006 | Smith et al. | | 356/401 |
| 2007/0008533 A1* | 1/2007 | Ghinovker | | 356/401 |
| 2008/0273157 A1* | 11/2008 | Nakano et al. | | 349/149 |

* cited by examiner

Calculating at least one layer misalignment between layers of an electronic circuit. The layers are expected to be mutually aligned. The layers are manufactured at least by a direct imaging device that exposes a photo-resistive material to radiation to provide a pattern. 210

Selecting, in response to the estimated layers misalignment and in response to an allowable misalignment threshold, a selected response out of: (i) amending the manufacturing process of additional layers of the electrical process, (iii) stopping the manufacturing process of the electrical circuit. 220

Participating in executing the selected response. 230

| Calculating at least one layer misalignment between layers of an electronic circuit. The layers are expected to be mutually aligned. The layers are manufactured at least by a direct imaging device that exposes a photo-resistive material to radiation to provide a pattern. 210' |
|---|

| Selecting between a group of selected responses, wherein the group of selected responses can include any combination of the following stages: (i) manufacturing additional layers of the electrical circuits, (ii) stopping the manufacturing process of the electrical circuit, (iii) replacing a layer that was expected to belong to a first electrical circuit by a layer that was expected to belong to another electrical circuit; and (iv) removing a non-developed photo-resistive pattern of a layer of the electrical circuit and generating an amended photo-resistive pattern; (v)) amending the manufacturing process of additional layers of the electrical circuit; (vi) repeating a manufacturing process stage of a certain layer of the integrated circuit, and (vii) replacing a previously manufactured certain layer by a currently manufactured certain layer that is manufactured during the repetition of the manufacturing process stage. 220' |
|---|

| Participating in executing the selected response. 230' |
|---|

METHOD AND SYSTEM FOR CONTROLLING A MANUFACTURING PROCESS

RELATED APPLICATIONS

This application is a National Phase Application of PCT International Application No. PCT/IL2008/001011, International Filing Date Jul. 22, 2007, claiming priority of Provisional Patent Application, 60/951,211, filed Jul. 22, 2007 and 60/954,078, filed Aug. 6, 2007.

FIELD OF THE INVENTION

This application related to methods for controlling a manufacturing process.

BACKGROUND OF THE INVENTION

The manufacturing process of a Printed Circuit Board (PCB) incorporates various cyclical operations with raw materials. There are two basic technologies of PCB manufacturing: (i) Method of final assembly of several separately produced layers. This method allowing significantly higher dimensional instability tolerances during manufacturing of separate layers towards their final assembling, and (ii) Sequential built up method, when the PCB is created by consequent production of each next layer on top of previously finished layer and in this way avoiding necessity of final assembling process. This method intended for manufacturing of High Density PCB and thus allowing significantly lower dimensional instability tolerances of raw material during manufacturing process.

One of the major problems of manufacturing PCBs is dimensional instability of each layer. The layers can undergo various transformations during the manufacturing process.

There is a need to control the manufacturing process and respond to these dimensional instabilities that are hard to predict.

SUMMARY

A computer program product that includes a computer readable medium that stores instructions for: calculating at least one layer misalignment between layers of an electrical circuit that are expected to be mutually aligned; wherein the layers are manufactured by at least a direct imaging device that exposes a photo-resistive material to radiation to provide a pattern; selecting, in response to the at least one layer misalignment and in response to at least one allowable misalignment threshold, a selected response out of: manufacturing at least one additional layer of the electrical circuit; and stopping the manufacturing process of the electrical circuit; and participating in executing the selected response.

A system for controlling a manufacturing process of an electronic circuit, the system includes a memory unit and a processor; the memory unit is adapted to store image information of layers of an electrical circuit; the processor is adapted to: calculate at least one layer misalignment between layers of an electrical circuit that are expected to be mutually aligned; wherein the layers are manufactured by at least a direct imaging device that exposes a photo-resistive material to radiation to provide a pattern; select, in response to the at least one layer misalignment and in response to at least one allowable misalignment threshold, a selected response out of: manufacturing at least one additional layer of the electrical circuit; and stopping the manufacturing process of the electrical circuit; and participate in executing the selected response.

A method for controlling a manufacturing process of an electronic circuit, the method includes: calculating at least one layer misalignment between layers of an electrical circuit that are expected to be mutually aligned; wherein the layers are manufactured by at least a direct imaging device that exposes a photo-resistive material to radiation to provide a pattern; selecting, in response to the at least one layer misalignment and in response to at least one allowable misalignment threshold, a selected response out of: manufacturing at least one additional layer of the electrical circuit; and stopping the manufacturing process of the electrical circuit; and executing the selected response.

BRIEF DESCRIPTION OF THE DRAWINGS

The foregoing and other objects, features, and advantages of the present invention will become more apparent from the following detailed description when taken in conjunction with the accompanying drawings. In the drawings, similar reference characters denote similar elements throughout the different views, in which:

FIG. 2 illustrates a method according to an embodiment of the invention;

FIG. 3 illustrates a method according to an embodiment of the invention;

DETAILED DESCRIPTION OF THE INVENTION

A system, method and computer program product are provided. They can control a manufacturing process of an electrical circuit such as a PCB. The manufacturing process is controlled in view of layer misalignment (detected or evaluated) and an allowed misalignment threshold. The controlling can include at least one of the following or a combination thereof: (i) amending a manufacturing process parameter of one or more layer of one or more electrical circuit, (ii) stopping the manufacturing process of one or more electrical circuits, (iii) repeating one or more manufacturing process stages.

The term "layer misalignment" can reflect one or more misalignments between one or more points of a first layer and one or more points of a second layer. Each of these points of the first layer was expected to be aligned with a corresponding point of the second layer. For example, a misalignment can be defined between a feature of a first layer and a corresponding feature of a second layer that were expected to be aligned. Yet for another example, a layer misalignment can reflect the overall misalignment between one layer to the other. Yet for a further example, a layer misalignment can reflect a misalignment between a portion of the first and a portion of a second layer. A layer misalignment can represent one or more local misalignments, and can be obtained by processing (for example, statistical processing) multiple local misalignments. A local misalignment can be a misalignment between a first feature of a first layer to a second feature of a second layer.

A layer misalignment of a certain layer can be evaluated by comparing between one or more actual locations of one or more features of the certain layer and the desired (expected) one or more locations of these one or more features. The desired location can be obtained from a data base, from a reference representative of the certain layer or from another layer (usually another layer that is expected to be adjacent to the certain layer).

When comparing between features of different layers these features can be imaged by light or can be imaged by radiation (such as x-rays) that can disclose features of layers that are below an upper layer. Thus, an automatic optical inspection (AOI) tool or another tool can utilize x-rays to detect features of a layer that are below an upper layer of a group of layers.

Reference layer information can be calculated from image data obtained from one or more automatic optical inspection tools, can be obtained from processing image data representative of multiple electrical circuits (such as electrical circuits that belong to the same batch), and the like. Reference layer information can be stored in a central memory unit or in multiple memory units.

Figure 1:
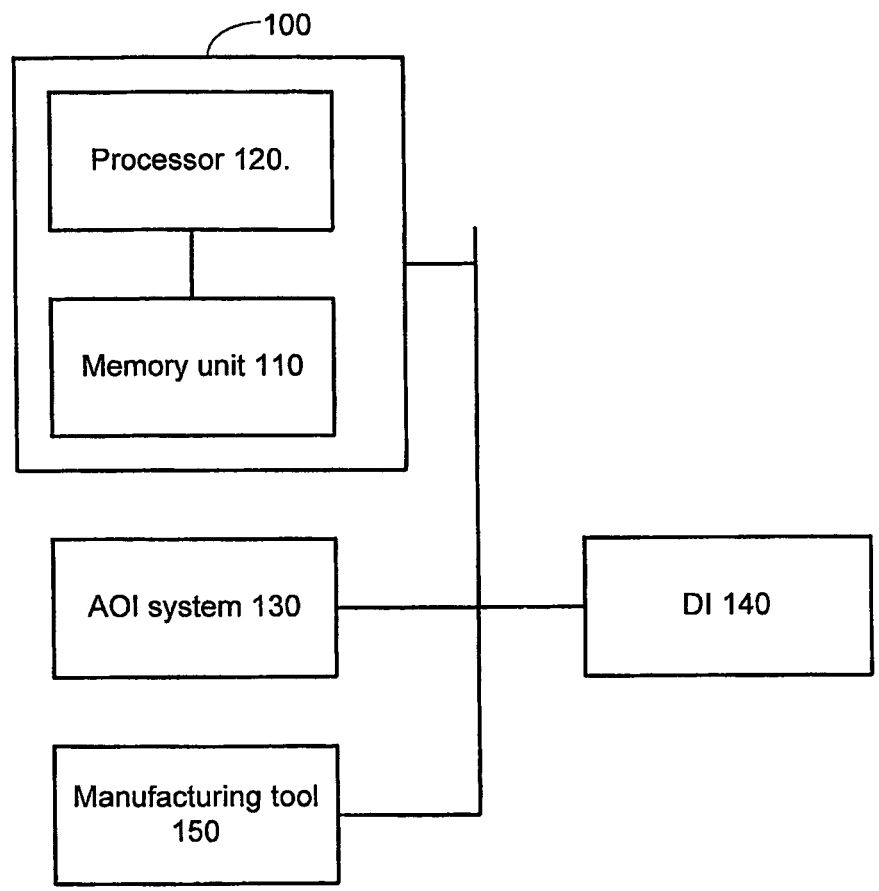
FIG. 1 illustrates a system according to an embodiment of the invention.

FIG. 1 illustrates a single memory unit and a single AOI tool, but other configurations can be implemented. For example, one or more systems can be connected to multiple AOI tools and, additionally or alternatively, to multiple DI tools.

A layer misalignment can include one or more local misalignments. A local misalignment can be determined by measuring the spatial relationships between features that are expected to be mutually aligned. Additionally or alternatively, the local misalignment can be measured by comparing the distances between features that are not expected by be mutually aligned but are expected to be at a certain location in relation to each other. Additionally or alternatively, a local misalignment of a certain group of features can be estimated based upon the misalignment between features of another group of features, especially if the spatial relationship between the features of the two groups are known or can be estimated.

For example, assuming that there is a first group of ideally mutually aligned features and a second group of ideally mutually aligned features and the relationship between the misalignment of features of the first group and the misalignment of features of the second group is known or can be estimated, then after measuring the misalignment of features of the second group the misalignment of the second group can be evaluated. The estimation can be determined based upon past measurements, can be responsive to the distance between these two groups of features, to the similarity between the features, and the like. Typically, if the two groups are very close to each other and are expected to be manufactured under the same manufacturing conditions then the estimation can be more accurate.

It is noted that one or more local misalignments (even a local misalignment that exceeds an allowed local misalignment threshold) can be ignored and that the manufacturing process can continue despite one or more deviations of local misalignments from the allowed misalignments.

FIG. 1 illustrates system 100 and its environment according to an embodiment of the invention.

System 100 includes memory unit 110 and processor 120. Its environment can include one or more automatic optical inspection (AOI) systems such as AOI system 130, one or more direct imaging device (DI) such as DI 140 and one or more additional manufacturing tools, such as manufacturing tool 150.

It is noted that system 100 or at least one component out of memory unit 110 and processor 120 can be integrated with AOI 130 or with DI 140.

It is further noted that AOI 130 can be integrated with DI 140, and that both systems (AOI and DI) can inspect a layer of an electrical circuit simultaneously or in a sequential manner.

Manufacturing tool 150 has developing and etching capabilities. It is noted that one tool can perform the developing and yet another perform the etching, but this is not necessarily so.

Conveniently, a certain layer of the integrated circuit is manufactured by executing the following manufacturing stages: (i) generating a layer of photo-resistive layer, (ii) exposing, by DI 140, the photo-resistive layer to radiation (for example light, laser) to provide a photo-resistive pattern; (iii) imaging, by AOI 130, the photo-resistive pattern to provide image, information to system 100, (iv) selecting, by system 100 and especially by processor 120, in response to layer misalignment, and at least one allowed misalignment threshold, a selected response, and (v) executing the selected response.

By applying the imaging and selecting after the photo-resistive is formed but before performing additional stages (such as developing, etching, and laser drilling) the selected response can include removing the photo-resistive pattern and generating an amended photo-resistive pattern. According to another embodiment of the invention the imaging and selecting can be executed after a certain manufacturing process stage that can not be reversed (for example, after developing the photo-resistive pattern, after etching) and in this case the selected response can not include removing the photo-resistive pattern and generating an amended photo-resistive pattern. Thus, for example, the imaging can include imaging a conductive pattern—after the etching stage was completed.

It is noted that the imaging and selecting can be executed after each manufacturing process stage and even multiple times per layer. For example, the selection can occur after the photo-resist pattern is formed, and after the photo-resistive pattern is developed and etched and even after laser drilling.

The response can include: (i) continuing to manufacture the electrical circuit by manufacturing tool 150, (ii) amending the manufacturing process of a next layer of the electrical circuit by modifying the pattern to be imprinted by DI 140, (iii) removing the photo-resistive layer and repeating the generation of the photo-resistive layer and exposing the material to provide a photo-resistive pattern, (iv) modifying the pattern of the certain layer to be imprinted by DI 140, removing the photo-resistive layer and repeating the generation of the photo-resistive layer and exposing the material to provide an amended photo-resistive pattern, (v) stopping the manufacturing process of other layers of the integrated circuit and declaring this electrical circuit as a failed electrical circuit, (vi) stopping the manufacturing process of one or more other integrated circuits and declaring these one or more electrical circuits as failed electrical circuits, (vii) replacing one layer by another—especially one layer that was expected to belong to one integrated circuit with a corresponding layer that was expected to belong to a second integrated circuit.

It is noted that responses (iii) and (iv) can be executed if the inspecting and the selecting is done before developing the photo-resists. It is noted that response (vii) can be selected before the layers to be replaced are connected to other layers.

Processor 120 can select between these stages in response to one or more layer misalignment (detected or evaluated) and one or more allowed misalignment threshold. The allowed misalignment thresholds can be determined per layer, per manufacturing process stage, per local misalignment and the like.

For example, if an integrated circuit includes multiple (n) layers then (n−1) allowed misalignment thresholds can be defined. Yet for another example, when manufacturing the m'th layer (m<n) the method can compare the layer misalignments between the m layers but can, additionally or alternatively, try to estimate the expected misalignment after manufacturing one or more next layers (such as after manufacturing the (m+1)'th layer, the (m+2)'th layer and up till the n'th layer).

If, after manufacturing m'th layers the layers are misaligned by more than the allowed misalignment threshold of this stage then the method can select whether the misalignment can be amended, can not be amended or should not be amended.

For example, the manufacturing process should not be amended if layer misalignments of currently manufactured layers as well as the expected misalignment of future layers are within allowed misalignment thresholds.

For example, even if these conditions are fulfilled, processor 120 can determine to amend the manufacturing process of the remaining layers in order to reduce an expected misalignment with the future layers.

For example, processor 120 can determine that one layer should be replaced by another corresponding layer in order to reduce the layers misalignment. This can be performed before these layers are connected to other layers. Processor 120 can receive information indicative of misalignments of layers of different electrical circuits and replace layers that were originally intended to be included in one electrical circuit by another.

For example, processor 120 can determine to manufacture a layer and replace an already manufactured layer by the newly manufactured layer.

The selection of the selected operation can be responsive to the "cost" of such operation. The "cost" can reflect a monetary cost, time required for performing the selected response, probability of introducing errors in the manufacturing process, and the like. For example, if the cost of replacing a layer, amending a manufacturing process or repeating a manufacturing stage is higher than just starting to manufacture the electrical circuit from scratch, then processor 120 can select to stop the manufacturing process.

Conveniently, processor 120 can: (i) calculate layer misalignments between layers of the electronic circuit; wherein the layers are expected to be mutually aligned; wherein the layers are manufactured by a direct imaging device that exposes a photo-resistive material to radiation to provide a pattern; (ii) estimate layers misalignment after a completion of a manufacturing process of the electrical circuit; and (iii) select, in response to the estimated layers misalignment and in response to an allowable misalignment threshold, a selected response out of: (a) manufacturing additional layers of the electrical circuits, (b) amending the manufacturing process of additional layers of the electrical process, and (c) stopping the manufacturing process of the electrical circuit; and (iv) participate in the execution of the selected response.

Conveniently, processor 120 can also select to repeat a manufacturing process stage of at least one layer of the group of layers.

It is noted that the layers misalignment of one electrical circuit can influence a selection of a selected response of other electrical circuits (for example, electrical circuits that are included in the same batch, electrical circuits that were subjected to substantially the same manufacturing process conditions, and the like).

For example, processor 120 can select, in view of layer misalignment of a certain electrical circuit, to select a selected response that is related to the manufacturing process of other electrical circuits. For example, processor 120 can determine to stop the manufacturing process of other electrical circuits that share at least one manufacturing process attribute (such as same process conditions) with the electrical circuit.

Conveniently, processor 120 can instruct DI 140 and/or manufacturing tool 150 to repeat a manufacturing process stage of at least one layer of the group of layers if it evaluates that the repetition will assist in providing an electrical circuit that includes a set of features that are misaligned by less than an allowable misalignment threshold.

Conveniently, processor 120 can instruct DI 140 and/or manufacturing tool 150 to repeat a manufacturing process stage of at least one layer of the group of layers and replace a previously manufactured layer by a layer that is manufactured during the repetition of the manufacturing process stage, if it evaluates that the repetition and replacement will assist in providing an electrical circuit that comprises a set of features that are misaligned by less than an allowable misalignment threshold.

Conveniently, processor 120 can calculate layer misalignment before a development of a photo-resistive pattern; determining to repeat a manufacturing process stage to provide an amended photo-resistive pattern; and instruct DI 140 or manufacturing tool 150 to remove the photo-resistive pattern and manufacture the amended photo-resistive pattern.

Conveniently, AOI 130 or a dedicated tool (not shown) can user layer penetrating radiation (such as x-rays) to inspect a group of features that are connected to each other to detect features located below an upper layer of the group of features.

According to an embodiment of the invention AOI 130 begins to inspect a layer of the manufacturing process before DI 140 completes the manufacturing process of that layer and processor 120 is capable of processing image information (relating to this layer) and even stop the manufacturing process after beginning to manufacture a layer of the electrical circuit but before completing the manufacturing of the layer of the electrical circuit.

According to an embodiment of the invention, processor 120 can generate instructions or otherwise modify next layer manufacturing process information that will cause DI 140 in response to the calculated misalignments; wherein the next layer is to be manufactured after the calculating.

System 100 can execute any of the following stages of method 200 that is illustrated below.

It is noted that when a manufacturing process of an electrical circuit is stopped, the manufacturing process of future layers or future electrical circuits should be amended in order to prevent a repetition of a faulty manufacturing process.

It is noted that an amendment to the manufacturing process can include changing a manufacturing parameter of DI 140, of manufacturing tool 150 or both. This change can involve changing pattern information that controls the imprinting of a photo-resistive pattern, can include changing the photo-resistive layer (the material, the thickness of the photo-resistive layer), can involve altering the temperature of a development process, making the etching process more (or less) corrosive and the like.

FIG. 2 illustrates method 200 according to an embodiment of the invention.

Method 200 starts by stage 210 of calculating one or more layer misalignments. The layers are expected to be mutually aligned. Different layers are manufactured by at least a direct imaging device that exposes a photo-resistive material to radiation to provide a pattern. Other stages of the manufacturing process (such as etching, photoresist layer deposition, development of the photo-resistive pattern, deposition of conductive material) can be performed by other tools.

Stage 210 can be preceded by receiving image information. The image information can be obtained by inspecting a group of layers that are connected to each other to detect features located below an upper layer of the group of layers.

Stage 210 can include calculating, or rather estimating, a misalignment between features of one group of features in response to measured spatial relationships between features that belong to another group of features.

Stage 210 can be responsive to image information obtained during the manufacturing of at least one layer by the direct imaging device.

Stage 210 can be executed by a processor in response to image information provided by an automatic optical inspection tool; and the selected response can include stopping a manufacturing process of a direct imaging device.

Stage 210 can include evaluating, in response to one or more layer misalignment, whether a completion of the manufacturing process will provide an electrical circuit that fulfills one or more allowed misalignment thresholds.

Stage 210 can include inspecting a group of features that are connected to each other to detect features located below an upper layer of the group of features.

Stage 210 is followed by stage 220 of selecting, in response to the at least one layer misalignment and in response to at least one allowable misalignment threshold, a selected response.

Stage 220 can include selecting between: (i) manufacturing at least one additional layer of the electrical circuit; and (ii) stopping the manufacturing process of the electrical circuit.

Stage 220 can include selecting between: (i) manufacturing additional layers of the electrical circuits, (ii) stopping the manufacturing process of the electrical circuit, and (iii) amending the manufacturing process of additional layers of the electrical circuit.

Stage 220 can include selecting between: (i) manufacturing additional layers of the electrical circuits, (ii) stopping the manufacturing process of the electrical circuit, and (iii) stopping the manufacturing process of other electrical circuits that share at least one manufacturing process attribute with the electrical circuit.

Stage 220 can include selecting between: (i) manufacturing additional layers of the electrical circuits, (ii) stopping the manufacturing process of the electrical circuit, and (iii) removing a non-developed photo-resistive pattern of a layer of the electrical circuit and generating an amended photo-resistive pattern.

Stage 220 can include selecting between: (i) manufacturing additional layers of the electrical circuits, (ii) stopping the manufacturing process of the electrical circuit, and (iii) replacing a layer that was expected to belong to a first electrical circuit by a layer that was expected to belong to another electrical circuit.

Stage 220 can include selecting between: (i) manufacturing additional layers of the electrical circuits, (ii) stopping the manufacturing process of the electrical circuit, (iii) repeating a manufacturing process stage of a certain layer of the integrated circuit and (iv) replacing a previously manufactured certain layer by a currently manufactured certain layer that is manufactured during the repetition of the manufacturing process stage.

Stage 220 can include selecting between: (i) manufacturing additional layers of the electrical circuits, (ii) stopping the manufacturing process of the electrical circuit, (iii) amending the manufacturing process of additional layers of the electrical circuit; and (iv) removing a non-developed photo-resistive pattern of a layer of the electrical circuit and generating an amended photo-resistive pattern.

Stage 220 can include selecting between: (i) manufacturing additional layers of the electrical circuits, (ii) stopping the manufacturing process of the electrical circuit, (iii) replacing a layer that was expected to belong to a first electrical circuit by a layer that was expected to belong to another electrical circuit; and (iv) replacing a previously manufactured certain layer by a currently manufactured certain layer that is manufactured during the repetition of the manufacturing process stage.

Stage 220 can include selecting between: (i) manufacturing additional layers of the electrical circuits, (ii) stopping the manufacturing process of the electrical circuit, (iii) amending the manufacturing process of additional layers of the electrical circuit; (iv) repeating a manufacturing process stage of a certain layer of the integrated circuit, and (v) replacing a previously manufactured certain layer by a currently manufactured certain layer that is manufactured during the repetition of the manufacturing process stage.

FIG. 3 illustrates method 200' according to an embodiment of the invention. Method 200' starts by stage 210'. Stage 210' is followed by stage 220' of selecting between a group of selected responses, wherein the group of selected responses can include any combination of the following stages: (i) manufacturing additional layers of the electrical circuits, (ii) stopping the manufacturing process of the electrical circuit, (iii) replacing a layer that was expected to belong to a first electrical circuit by a layer that was expected to belong to another electrical circuit; and (iv) removing a non-developed photo-resistive pattern of a layer of the electrical circuit and generating an amended photo-resistive pattern; (v) amending the manufacturing process of additional layers of the electrical circuit; (vi) repeating a manufacturing process stage of a certain layer of the integrated circuit, and (vii) replacing a previously manufactured certain layer by a currently manufactured certain layer that is manufactured during the repetition of the manufacturing process stage.

Referring back to FIG. 2, stage 220 can include selecting to stop the manufacturing process of the electrical circuit if evaluating that the misalignment can not be amended (to fall within one or more allowed misalignment thresholds) or is too "costly" to amend.

Stage 220 can include determining to continue the manufacturing process (with or without amendments or replacements). The selection can be responsive to the cost of an amendment.

Stage 220' is followed by stage 230' of participating in executing the selected response. Stage 230' can include triggering a selected response, initiating the selected response, requesting from another system or tool to perform that selected response, executing a part of the selected response or executing the entire selected response.

Stage 210' can include estimating a layer misalignment of at least one manufactured layer and at least one next layer to be manufactured.

A manufacturing process stage of a layer can be stopped before a completion of that stage. Image information can be obtained during the manufacturing process stage of the layer and the selection of the response as well as the execution of the response can be performed before the stage is completed. Additionally or alternatively, the manufacturing process stage of a layer can be stopped (before being completed) in response to information obtained from another layer. Accordingly, the manufacturing process and the selection process can be executed in a pipelined manner.

Figure 4:
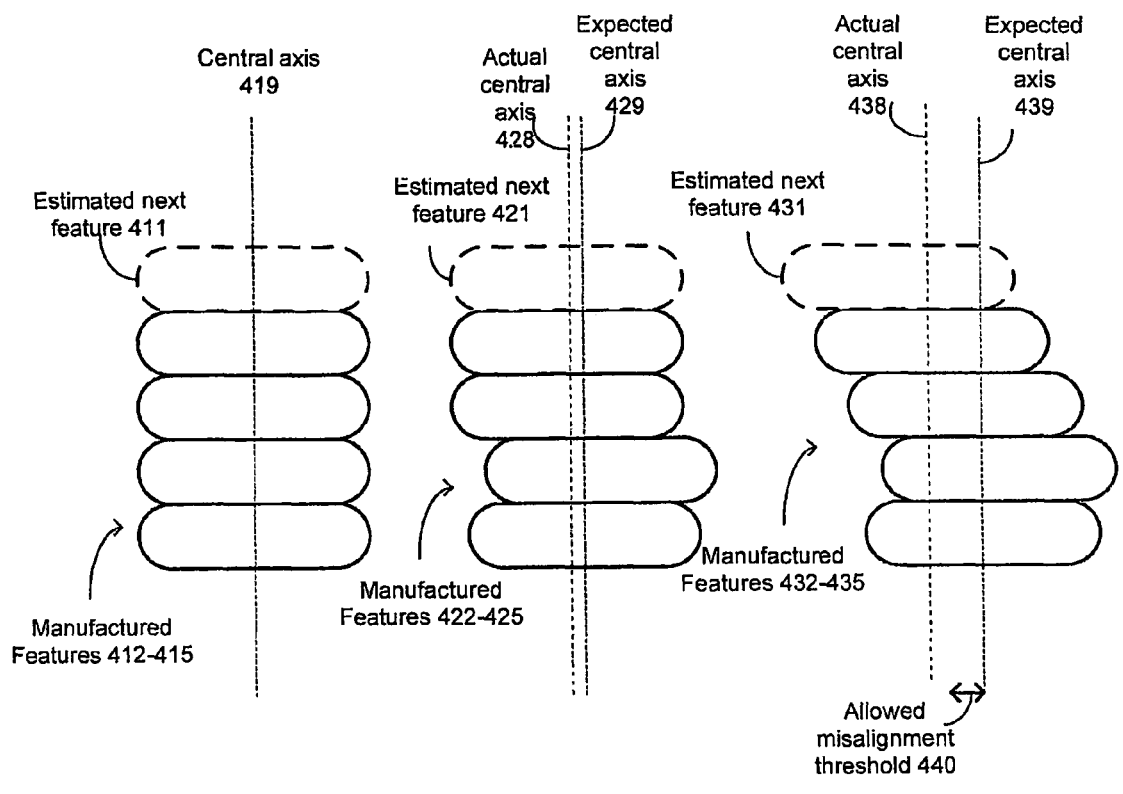
FIG. 4 illustrates multiple features, according to an embodiment of the invention.

FIG. 4 illustrates multiple features, according to an embodiment of the invention.

These features are arranged in three groups: (i) first group 410 that includes features that are substantially aligned to each other; (ii) second group 420 that includes features that are slightly misaligned in relation to each other; and (iii) third group 430 that includes features that are substantially misaligned in relation to each other. Each group was expected to include mutually aligned features. Processor 120 can determine not to amend the manufacturing process that produced first group 410, can determine to amend the manufacturing process that produced second group 420 and can determine to stop the manufacturing process of an electrical circuit that includes third group 430.

FIG. 4 illustrates manufactured features 412-415 of first group 410, and a location of the next feature 411 that should belong to the next layer. The first group is aligned and has a central axis 419 that passes through the middle of each of the features of first group 410. The location of next feature 411 can be estimated based upon the locations of manufactured features 412-415, based upon information relating to an expected misalignment of the next layer (that includes next feature 411), can be based on information obtained from previous manufacturing stages of other electrical circuits, and the like.

FIG. 4 illustrates manufactured features 422-425 of second group 420, and a location of the next feature 421 that should belong to the next layer. The second group is slightly misaligned and has an actual central axis 428 that slightly deviates from the expected central axis 429.

FIG. 4 illustrates manufactured features 432-435 of third group 430, and a location of the next feature 431 that should belong to the next layer. The third group is substantially misaligned and has an actual central axis 438 that substantially deviates from the expected central axis 439. The distance between these two axis exceeds allowed alignment threshold 440.

Figure 5:
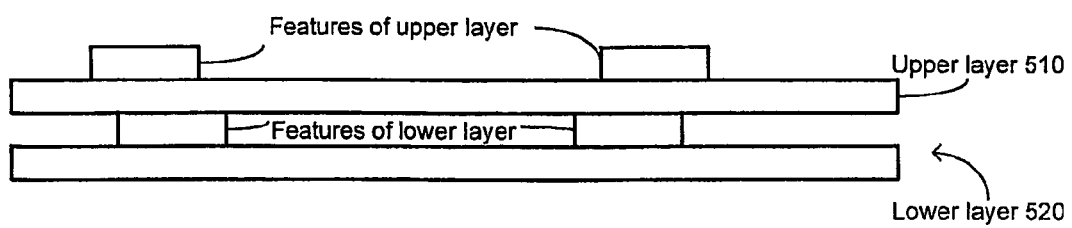
FIG. 5 illustrates multiple layers according to an embodiment of the invention.

FIG. 5 illustrates multiple layers 510-520 according to an embodiment of the invention. FIG. 5 illustrates that features of a certain layer (for example, layer 520) can be imaged by using x-rays even after layer 510 is manufactured and is placed above lower layer 520. This can assist during the measurement of the layers misalignment.

A computer program product can be provided. It includes a tangible computer readable medium that stores instructions for executing any stage of method 200. The tangible computer readable medium can be a chip, multiple semiconductor memory cells, a disk, a diskette, a CD, a DVD, it can be read by using electromagnetic radiation such as light, magnetic fields, and the like.

For example, the tangible medium, can store instructions for: (a) calculating at least one layer misalignment between layers of an electrical circuit that are expected to be mutually aligned; wherein the layers are manufactured by at least a direct imaging device that exposes a photo-resistive material to radiation to provide a pattern; (b) selecting, in response to the at least one layer misalignment and in response to at least one allowable misalignment threshold, a selected response out of a group of selected responses that comprises a combination of multiple responses out of: manufacturing additional layers of the electrical circuits, stopping the manufacturing process of the electrical circuit, amending the manufacturing process of additional layers of the electrical circuit; repeating a manufacturing process stage of a certain layer of the integrated circuit and replacing a previously manufactured certain layer by a currently manufactured certain layer than is manufactured during the repetition of the manufacturing process stage; replacing a layer that was expected to belong to a first electrical circuit by a layer that was expected to belong to another electrical circuit; and removing a non-developed photo-resistive pattern of a layer of the electrical circuit and generating an amended photo-resistive pattern; and (c) participating in the execution of the selected response.

For example, the tangible medium, can store instructions for: (a) calculating at least one layer misalignment between layers of an electrical circuit that are expected to be mutually aligned; wherein the layers are manufactured by at least a direct imaging device that exposes a photo-resistive material to radiation to provide a pattern; (b) selecting, in response to the at least one layer misalignment and in response to at least one allowable misalignment threshold, a selected response out of: manufacturing at least one additional layer of the electrical circuit; and stopping the manufacturing process of the electrical circuit; and executing the selected response; and (c) participating in the execution of the selected response.

The present invention can be practiced by employing conventional tools, methodology, and components. Accordingly, the details of such tools, component, and methodology are not set forth herein in detail. In the previous descriptions, numerous specific details are set forth, in order to provide a thorough understanding of the present invention. However, it should be recognized that the present invention might be practiced without resorting to the details specifically set forth.

Only exemplary embodiments of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method for controlling a manufacturing process of a printed circuit board, the method comprising:

calculating at least one layer misalignment between layers of the printed circuit board that are expected to be mutually aligned; wherein the layers are manufactured by at least a direct imaging device that exposes a photo-resistive material to radiation to provide a pattern; wherein the calculating is responsive to at least one image acquired by an automatic optical inspection tool;

selecting, if the at least one layer misalignment does not exceed the at least one allowable misalignment threshold, a first selected response that comprises manufacturing at least one additional layer of the printed circuit board; and selecting a second selected response out of a plurality of responses, if the at least one layer misalignment exceeds the at least one allowable misalignment threshold;

wherein the selecting of the second selected response is responsive to a cost of an execution of response of each of the plurality of responses.

2. The method according to claim 1 wherein the cost of each response of the plurality of responses represents a probability of introducing errors, due to the execution of the response, in a manufacturing process used for manufacturing the at least one additional layer of the printed circuit board.

3. The method according to claim 1 wherein the cost of each response of the plurality of responses represents a time required for the execution of the response.

4. The method according to claim 1 wherein the cost of each response of the plurality of responses represents a monetary cost associated with the execution of the response.

5. The method according to claim 1 wherein the plurality of responses comprise: stopping the manufacturing process of the printed circuit board, and removing a non-developed photo-resistive pattern of a layer of the printed circuit board and generating an amended photo-resistive pattern.

6. The method according to claim 1 wherein the plurality of responses comprise: stopping the manufacturing process of the printed circuit board, and replacing a layer that was expected to belong to a first printed circuit board by a layer that was expected to belong to another printed circuit board.

7. The method according to claim 1 wherein the plurality of responses comprise: stopping the manufacturing process of the printed circuit board, repeating a manufacturing process stage of a certain layer of the printed circuit board; and replacing a previously manufactured certain layer by a currently manufactured certain layer that is manufactured during the repetition of the manufacturing process stage.

8. The method according to claim 1 wherein the plurality of responses comprise: stopping the manufacturing process of the printed circuit board, amending the manufacturing process of additional layers of the printed circuit board; repeating a manufacturing process stage of a certain layer of the printed circuit board and replacing a previously manufactured certain layer by a currently manufactured certain layer that is manufactured during the repetition of the manufacturing process stage; replacing a layer that was expected to belong to a first electronic circuit by a layer that was expected to belong to another electronic circuit; and removing a non-developed photo-resistive pattern of a layer of the printed circuit board and generating an amended photo-resistive pattern.

9. The method according to claim 1:
wherein the calculating of the at least one layer misalignment between layers of the printed circuit board comprises
calculating layer misalignments between a current layer of the printed circuit board and other layers; and
replacing a certain layer that was expected to (a) belong to the printed circuit board and (b) be aligned with the current layer, with a corresponding layer that was expected to belong to another printed circuit board in order to reduce misalignment with the current layer;
wherein the certain layer and the corresponding layer belong to the other layers.

10. The method according to claim 1 wherein the automatic optical inspection tool differs from the direct imaging device.

11. A system for controlling a manufacturing process of a printed circuit board, the system comprises a memory unit and a processor;
the memory unit is adapted to store image information of layers of the printed circuit board; wherein the image information is acquired by an automatic optical inspection tool;
the processor is adapted to:
calculate at least one layer misalignment between layers of the printed circuit board that are expected to be mutually aligned; wherein the layers are manufactured by at least a direct imaging device that exposes a photo-resistive material to radiation to provide a pattern; wherein the calculating is responsive to at least one image acquired by an automatic optical inspection tool;
select, if the at least one layer misalignment does not exceed the at least one allowable misalignment threshold, a first selected response that comprises manufacturing at least one additional layer of the printed circuit board; and
select a second selected response out of a plurality of responses, if the at least one layer misalignment exceeds the at least one allowable misalignment threshold;
wherein the selecting of the second selected response is responsive to a cost of an execution of response of each of the plurality of responses.

12. The system according to claim 11 wherein the cost of each response of the plurality of responses represents a monetary cost associated with the execution of the response.

13. The system according to claim 11 wherein the cost of each response of the plurality of responses represents a time required for the execution of the response.

14. The system according to claim 11 wherein the cost of each response of the plurality of responses represents a monetary cost associated with the execution of the response.

15. The system according to claim 11 wherein the plurality of responses comprise stopping the manufacturing process of the printed circuit board, and removing a non-developed photo-resistive pattern of a layer of the printed circuit board and generating an amended photo-resistive pattern.

16. The system according to claim 11 wherein the plurality of responses comprise
stopping the manufacturing process of the printed circuit board, and
replacing a layer that was expected to belong to the printed circuit board by a layer that was expected to belong to another printed circuit board.

17. The system according to claim 11, wherein the automatic optical inspection tool differs from the direct imaging device.

18. The system according to claim 11
wherein the processor is adapted to:
calculate layer misalignments between a current layer of the printed circuit board and other layers; and
instruct to replace a certain layer that was expected to (a) belong to the printed circuit board and (b) be aligned with the current layer, with a corresponding layer that was expected to belong to another printed circuit board in order to reduce misalignment with the current layer; wherein the certain layer and the corresponding layer belong to the other layers.

* * * * *